US011152890B2

(12) United States Patent
Chakraborty et al.

(10) Patent No.: US 11,152,890 B2
(45) Date of Patent: Oct. 19, 2021

(54) LOW POWER OSCILLATOR WITH DIGITAL AMPLITUDE CONTROL

(71) Applicant: International Business Machines Corporation, Armonk, NY (US)

(72) Inventors: Sudipto Chakraborty, Plano, TX (US); Rajiv Joshi, Yorktown Heights, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/800,348

(22) Filed: Feb. 25, 2020

(65) Prior Publication Data

US 2021/0265946 A1 Aug. 26, 2021

(51) Int. Cl.
*H03B 5/12* (2006.01)
*H03B 5/18* (2006.01)
*H03L 7/099* (2006.01)

(52) U.S. Cl.
CPC ......... *H03B 5/1212* (2013.01); *H03B 5/1228* (2013.01); *H03B 5/1234* (2013.01); *H03B 5/1253* (2013.01); *H03B 5/1265* (2013.01); *H03B 5/1293* (2013.01); *H03L 7/0991* (2013.01); *H03B 2200/0062* (2013.01); *H03L 2207/06* (2013.01)

(58) Field of Classification Search
CPC .. H03B 5/1212; H03B 5/1228; H03B 5/1234; H03B 5/1293; H03B 5/1265; H03B 5/1253; H03B 2200/0062; H03L 7/0991; H03L 2207/06

USPC ................ 331/117 R, 117 FE, 167
See application file for complete search history.

(56) References Cited

U.S. PATENT DOCUMENTS

| 7,012,472 | B2 | 3/2006 | Xu et al. |
| 7,038,552 | B2 | 5/2006 | Brett et al. |
| 7,415,369 | B1 * | 8/2008 | Wang .................. H03L 7/099 331/16 |
| 7,567,140 | B2 | 7/2009 | Kim |

(Continued)

OTHER PUBLICATIONS

Fanori et al., "Class-D CMOS Oscillator", IEEE Journal of Solid-State Circuits, vol. 48, No. 12, Dec. 2013, pp. 3105-3119.

*Primary Examiner* — Richard Tan
(74) *Attorney, Agent, or Firm* — Scully, Scott, Murphy & Presser, P.C.; Daniel P. Morris

(57) ABSTRACT

A voltage controlled oscillator (VCO) circuit employing digital amplitude control of the output oscillating signal and method of operation. The digital control is provided by an analog to digital converter (ADC) element that is shared among many other operating blocks in a system. In a configuration, the oscillator current is obtained by implementing transistors in a linear region and controlling them digitally. The optimum amplitude detection is performed by measuring the DC voltage at the common mode nodes in the oscillator, and is realized using reduced time compared to an extensive frequency measurement over a long time window. The digital control is implemented using an on-chip regulator, and employs digital controls for adjusting the current consumption which leads to low on-chip area overhead, low cost, and a scalable implementation. In an implementation, a one-time code can be obtained for optimum phase noise operation when providing the digital amplitude control.

20 Claims, 9 Drawing Sheets

(56) References Cited

U.S. PATENT DOCUMENTS

| | | |
|---|---|---|
| 7,659,788 B2 | 2/2010 | Koerner |
| 8,076,982 B2 * | 12/2011 | Suzuki ................. H03B 5/1293 |
| | | 331/117 FE |
| 9,172,328 B2 | 10/2015 | Lee et al. |
| 9,634,607 B2 | 4/2017 | Nguyen et al. |
| 9,780,725 B2 | 10/2017 | Chakrabarti et al. |
| 10,236,047 B1 | 3/2019 | Ryan et al. |
| 2012/0326794 A1 | 12/2012 | Kammula |

* cited by examiner

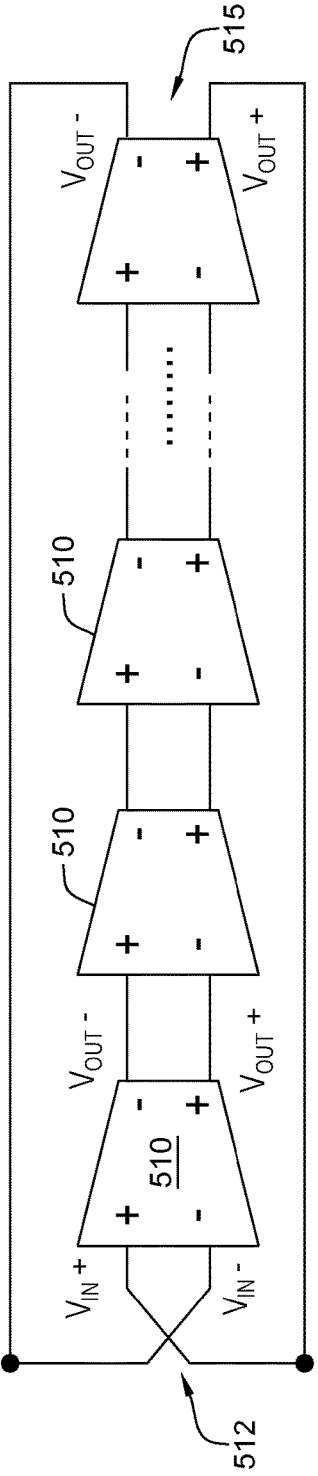
FIG. 5
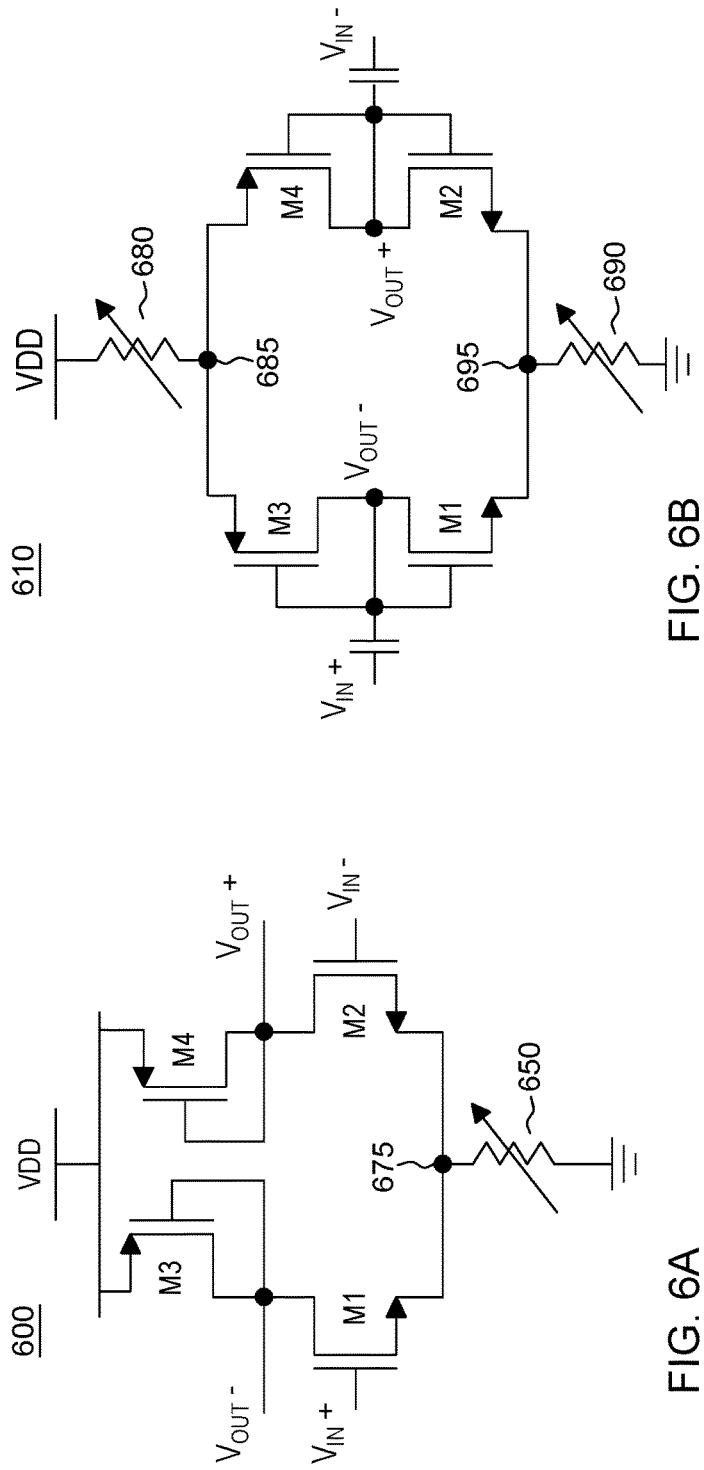
FIG. 6B
FIG. 6A

800

805

810

LOW POWER OSCILLATOR WITH DIGITAL AMPLITUDE CONTROL

FIELD

The present application relates to electronic oscillator circuits generally, and in particular, to a low power consuming oscillator circuit employing digital amplitude control for on-chip electronic circuits and a method of operation.

BACKGROUND

Low power oscillators are used extensively in electronic circuits, e.g., as peripheral circuits for memory systems. For example, voltage controlled oscillators are used for controlling memory refresh in dynamic random access memory (DRAM) or magnetoresistive RAM (MRAM) systems. That is, in such non-volatile memory systems there is a need for a clock, and an oscillator circuit can provide autonomous clock generation.

Traditional implementations and methods use analog amplitude control loops to ensure optimum phase noise and robust start up control. An analog amplitude control loop provides large current for robust startup and reduces current at steady state. However, analog amplitude control loops run continuously, leading to increased noise in the oscillator.

Further, an analog amplitude control loop consumes current, leading to overall high current consumption of the oscillator solution.

Thus, existing circuits employing analog type amplitude control methods lead to higher power consumption.

SUMMARY

Aspects of the invention provide an electronic oscillator circuit with digital amplitude control for lower power consumption and low area overhead.

Further, there is provided an electronic oscillator circuit employing cross-coupled transistors connected to a tank circuit including capacitors and inductive elements and a digitally programmable first tail resistor to provide adjustable bias currents using digital amplitude control that provides for lower power consumption and optimum oscillator phase noise operation.

Further aspects include a method of operating an electronic oscillator circuit employing cross-coupled transistors connected to a tank circuit including capacitors and inductive elements, and adjustable bias currents using a first programmable tail resistor, a second programmable tail resistor, or both first and second tail resistors to achieve oscillator amplitude tuning over a wide range of frequencies under digital control based on measured common node voltages intrinsic to the oscillator circuit.

In accordance with a first aspect of the invention, there is provided a voltage controlled oscillator (VCO). The VCO comprises: an active negative transconductance circuit comprising: cross-coupled transistor pair having drain terminals connected to a first end of a resonant tank circuit; a programmable tail resistor coupled to source terminals of the cross-coupled transistor pair at a common node, the programmable tail resistor sinking a bias current through the resonant tank circuit for tuning an amplitude of a VCO output oscillating signal; a switch for coupling the common node to an analog to digital converter (ADC) element, the ADC element sensing a voltage at the common node when the switch is activated and providing an output digital control signal; and a signal bus for carrying the digital control signal to the programmable tail resistor, the tail resistor programmed to a certain resistance according to bit values of the digital control signal for controlling the VCO output signal amplitude.

In accordance with a further aspect, there is provided a voltage controlled oscillator (VCO). The VCO comprises: a first active negative transconductance circuit comprising: first cross-coupled transistor pair having drain terminals connected to a first end of a resonant tank circuit; a first programmable tail resistor coupled to source terminals of the first cross-coupled transistor pair at a first common node, the programmable tail resistor sinking a bias current through the resonant tank circuit for tuning an amplitude of a VCO output oscillating signal; a first switch for coupling the first common node to an analog to digital converter (ADC) element, the ADC element sensing a voltage at the first common node when the switch is activated and providing a first output digital control signal; a first signal bus for carrying the first digital control signal to the first programmable tail resistor, the first tail resistor programmed to a certain resistance according to bit values of the first digital control signal for controlling the VCO output signal amplitude; and a second active negative transconductance circuit comprising: second cross-coupled transistor pair having drain terminals connected to a second end of the resonant tank circuit; a second programmable tail resistor coupled to source terminals of the second cross-coupled transistor pair at a second common node, the second programmable tail resistor sourcing a bias current through the resonant tank circuit for alternatively or additionally tuning an amplitude of a VCO output oscillating signal; a second switch for coupling the second common node to the ADC element, the ADC element alternatively or additionally sensing a voltage at the second common node when the second switch is activated and alternatively or additionally providing a second digital control signal; and a second signal bus for carrying the second digital control signal to the second programmable tail resistor, the second tail resistor programmed to a certain resistance according to bit values of the second digital control signal for alternatively or additionally controlling the VCO output signal amplitude.

In accordance with yet a further aspect, there is provided a method of operating a voltage controlled oscillator (VCO). The method comprises: upon initiating a circuit VCO oscillation, coupling, under control of a hardware processor element, a first common connected node of an active negative transconductance circuit of the VCO to an analog to digital converter (ADC) element, the active negative transconductance circuit including a cross-coupled transistor pair having coupled source terminals defining the first common connected node and drain terminals connected to a first end of a resonant tank circuit; sensing, by the ADC element, a voltage of a programmable tail resistor coupled to the common connected node; outputting by the ADC element, in response to the sensed voltage, a digital control signal; and providing the digital control signal to the programmable tail resistor and using bit values of the digital control signal to control a resistance value of the programmable tail resistor for controlling an amplitude of the VCO circuit oscillator signal output.

BRIEF DESCRIPTION OF THE DRAWINGS

FIG. 5 shows a ring oscillator (RVCO) circuit employing digital amplitude control according to a further embodiment;

FIG. 6A shows a detailed circuit schematic of a delay cell in the RVCO of FIG. 5 according to one embodiment;

FIG. 6B shows a detailed circuit schematic of a delay cell in the RVCO of FIG. 5 according to a further embodiment;

DETAILED DESCRIPTION

Figure 1:
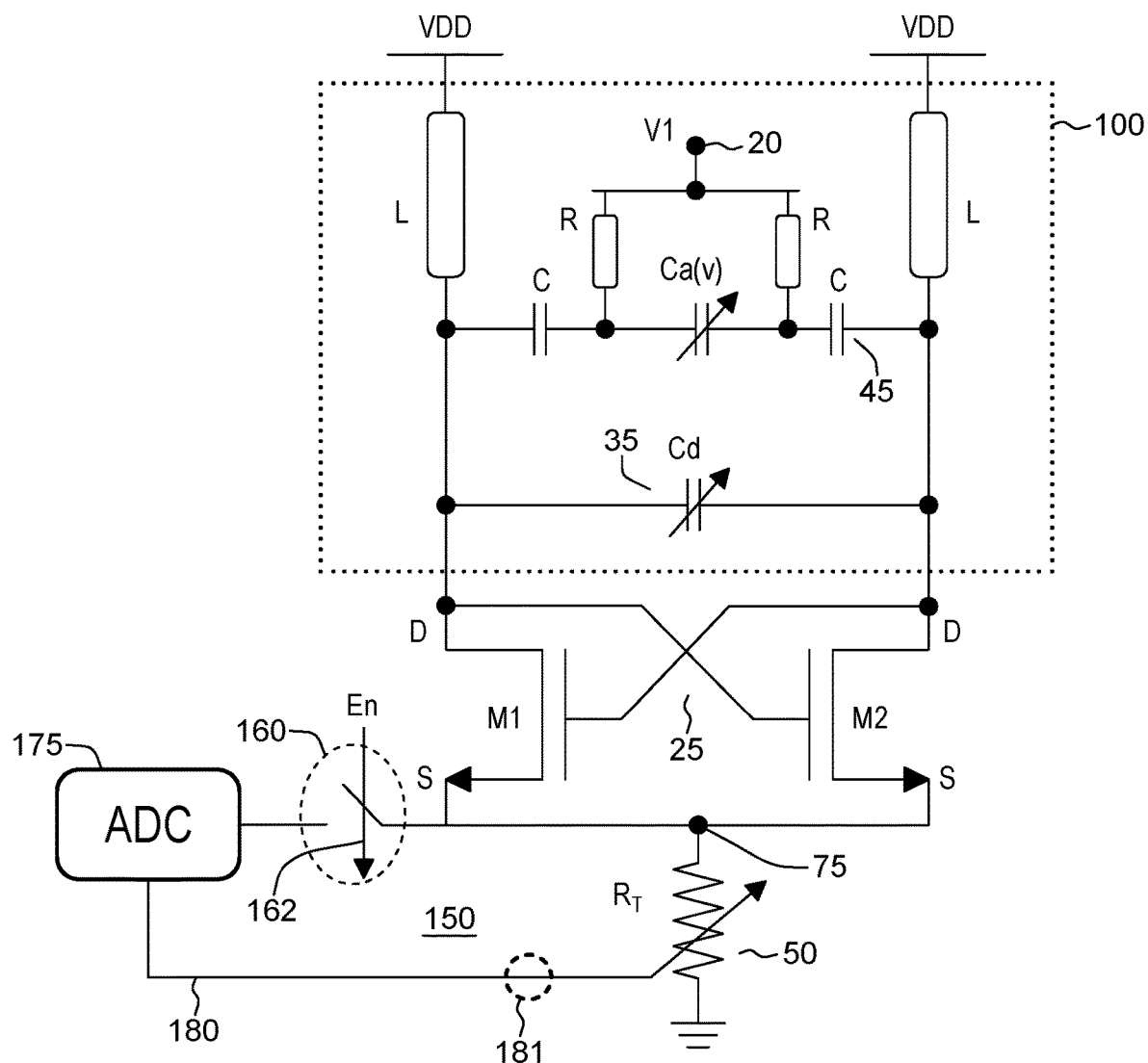
FIG. 1 depicts a circuit diagram of a voltage controlled oscillator circuit (VCO) employing an active negative transconductance circuit including cross-coupled transistors, connected to a oscillator tank circuit, and a digital control circuit for providing digital control of the VCO output signal amplitude based on a common mode node voltage.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

FIG. 1 depicts a circuit diagram of a voltage controlled oscillator (VCO) circuit 10 employing an active negative transconductance circuit including cross-coupled transistors, connected to a oscillator tank circuit, and a digital control circuit for providing digital control of the VCO output signal amplitude based on a "common mode" node voltage (i.e., a node having a common mode voltage intrinsic in the oscillator circuit structure; alternatively referred to as a "common node"). In an embodiment, the VCO circuit includes a tail resistor connected to a common node terminal of the cross-coupled pair of transistors, and employs digital amplitude control to adjust bias current through the tank circuit for output oscillating signal amplitude tuning and phase noise optimization according to an embodiment.

Figure 4A:
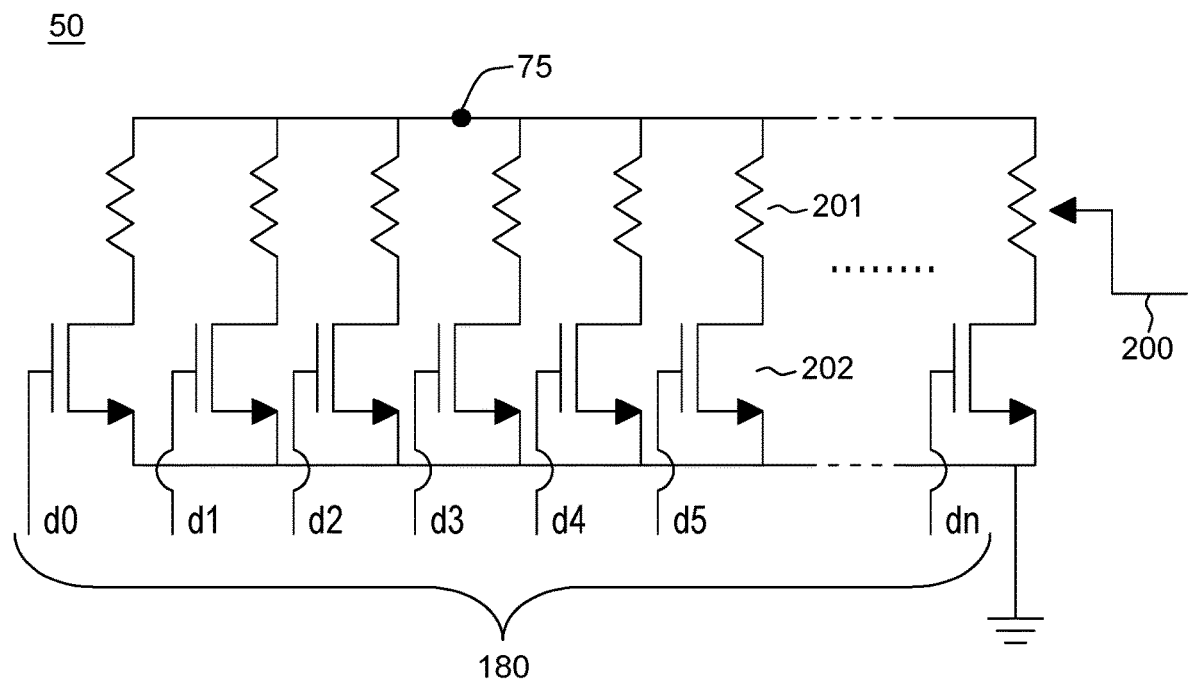
FIG. 4A shows a circuit schematic of a digitally programmable "NMOS tail" resistor $R_{TN}$ responsive to digital code word provided in ADC circuit loop for controlling VCO output signal amplitude according to an embodiment.

In the embodiment depicted in FIG. 1, the voltage controlled oscillator circuit 10 includes a cross-coupled metal-oxide-semiconductor (MOS) field effect transistor (FET) pair 25, e.g., an internal pair of MOS transistor M1 and MOS transistor M2 each having a gate, drain (D) and source (S) terminals, where the gates of each M1, (M2) device are connected to the drains (D) of the opposite device M2, (M1). A current source supplied by voltage supply VDD provides biasing current to operate each M1, M2 device through a respective connected individual inductor L. The source terminals (S) of respective MOS transistors M1, M2 are coupled together at a common node 75 and a bias current sink, i.e., a tail resistor 50 ($R_T$) further connects to the common node at these source terminals (S) of the respective transistors M1, M2 to provide a tail current through M1, M2 to ground. The tail resistor 50 is programmable via analog to digital loop control 150 and is configurable to provide different resistance values based on a received input digital code. In an embodiment, the programmable tail resistor 50 is a parallel configured resistor and/or transistor array such as shown in FIG. 4A. In an embodiment, tail resistor 50 can be transistor(s) operating in a linear range to provide a set resistance under digital control.

In embodiments, the oscillator can be a structure using cross-coupled NMOS transistors, cross-coupled PMOS transistors, or cross-coupled NMOS/PMOS transistors.

The load or oscillator output is a differential output, with a respective output connected at a respective MOSFET drain (D) of the cross-coupled pair. As known, a cross coupled transconductance pair of MOSFETs structure provide a negative resistance (negative transconductance) such that, in the presence of connected passive inductance and capacitance components provides a condition for oscillation when the negative "gm" structure compensates for the losses occurring due to the passive elements.

One way to control a center frequency of oscillation in the VCO device 10 of FIG. 1 is to digitally control one or more passive components, e.g., capacitors 35, 45 in a connected oscillator tank circuit. More typically, the controlling of a center frequency of oscillation in the VCO device 10 is to program a voltage variable capacitor, or varactor, which can continuously change the capacitance value as applied voltage to the capacitor is changed continuously, and which tunes the oscillator center frequency (e.g., analog tuning). The amplitude of the VCO is controlled by a quiescent current, i.e., a bias (tail) current through the tail resistor 50, and the impedance of the passive tank circuit (e.g., a parallel combination of inductor(s) and capacitor(s)).

As shown in FIG. 1, a tank circuit 100 is connected in parallel with cross-coupled transconductor 25. The oscillator LC tank circuit includes inductor elements L tied to VDD and a parallel configuration of series connected capacitors that couple alternating current (AC) signals. The parallel configuration of capacitors include one or more switchable capacitors 35 ($C_d$) connected between drain terminals (D) of the cross-coupled NMOS transistors M1, M2. A further configuration of series connected capacitors 45 is provided connected in parallel with switchable capacitors 35 that connect to drain terminals (D) across the cross-coupled transistor pair M1, M2. In the embodiment shown, the second series 45 of the parallel stack includes three capacitors connected in a series. In series connection 45, the second capacitor of the series is a connected varactor $C_a(V)$, with the varactor being connected to separate or same tuning voltage sources supplying respective bias voltage V to the varactor(s) via respective biasing (DC voltage) resistors (R). The voltage sources supplying respective bias voltage V1, can be generated on chip 20. In an embodiment, a current source for the oscillator tank circuit can be supplied by voltage supply VDD (e.g., providing approximately 1.0 Volts) through each of inductors L.

The embodiment of the VCO 10 shown in FIG. 1 is configurable, and embodiments described herein can include the VCO circuit configurations such as described in co-pending U.S. patent application Ser. No. 16/445,898, the whole contents and disclosure of which is incorporated by reference as if fully set forth herein. For example, inductor element L of tank circuit 100 can include coupled coils of a magnetic transformer or balun.

In embodiments, the digital controlled VCO circuit 10 of FIG. 1 can be used in any circuit application requiring a steady state oscillation, e.g., a Phase Locked Loop (PLL). In embodiments, the digital controlled amplitude for the VCO circuits described herein are provided as peripheral circuits for memory systems, e.g., used for controlling memory refresh in DRAM or MRAM memory systems that employ magnetic tunnel junctions (MTJ).

In embodiments, a "common mode" voltage representative of the oscillator signal output is sensed at a common mode node to ensure stable operation and particularly to correct amplitude of the oscillator output signal. For example, as shown in the VCO 10 of FIG. 1, a voltage is sensed from the common mode node 75 of the tail resistor $R_T$ 50. In operation, a switching enable signal 162 is generated by a separate on-chip controller (e.g., a processor such as a digital microcontroller) to activate a switch 160 that couples the common node 75 via a conductor to an on-chip analog-to-digital converter (ADC) element 175 of the ADC control loop (ADC loop) 150. In an embodiment, the ADC 175 is a shared resource in an overall system. Further, in an embodiment, the ADC 175 is a successive-approximation-register (SAR) ADC for digitizing the common node voltage measurement. In an embodiment, the SAR ADC 175 is a 4-bit or 6-bit device of small area that detects a common mode voltage that provides an output that is read by a processor which, in response, generates a programmable resistor code for controlling programmable tail resistor $R_T$ 50 in ADC measurement loop 150.

The generated output resistor code (i.e., 2 bits, 4 bits, 6 bits or up to n-parallel bits) can each be used to controls $R_T$ 50 in loop 150. For example, a coarse adjustment can be made which is an adjustment to compensate for process variations, and a more "fine" adjustment can be made to adjust for small variations in order to achieve the best possible jitter performance "after" the coarse adjustments are performed. In an embodiment, a coarse adjustment uses less number of bits (e.g., 2 bits) and a fine adjustment uses a more increased number of bits (e.g., 6) to adjust the tail voltage, i.e., the voltage value at the node representing the common mode signal. When the tail resistor is connected between this node and ground reference, the tail voltage is the voltage across that resistor. However, the tail voltage does not always need to be equal to the voltage across the resistor. In an embodiment, the coarse adjustment may be performed outside of the ADC measurement loop 150.

Before the time the VCO oscillations start, this common mode/tail voltage at common node 75 is at a minimum and increases in value as the oscillator starts up. According to an embodiment, the analog-to-digital control loop (ADC loop) 150 which includes the on-chip ADC converter device 175 is switched in to receive and measure the voltage at the tail resistor common node. In an embodiment, the ADC converter devices senses a voltage "jump" which is the change (increase) in the tail voltage (i.e., common mode) at node 75 at the time the oscillator commences operation. The ADC output is read by the processor that responsively outputs a digital control code 180 as an input to the tail resistor $R_T$ value via a digital signal bus, e.g., bus 181. The programmed digital control code 180 adjusts the resistance and consequently the bias current through tail resistor $R_T$ 50 to control the VCO output signal amplitude according to a desired setting. The digital control code can be obtained using a look-up table that includes a setting to ensure stable oscillation and optimized phase noise operation. Upon attaining the desired VCO output signal amplitude setting and optimum phase noise, the enable signal 162 is switched off to deactivate switch 160 and remove the coupling of the common mode node 75 to the ADC loop.

FIG. 4A shows a detailed embodiment of tail resistor $R_T$ 50 of FIG. 1 including node 75 at which the common mode voltage is measured by the ADC 175 in ADC circuit loop 150. In the embodiment of FIG. 4A, the tail resistor is a resistor array 200 with parallel connected resistors 201, each respective resistor connected in series with a respective transistor device 202 operable in the linear region and each gated under control of a respective digital control bit signal which may be part of a bit coded word 180 output of the ADC. The transistor device 202 in series connection with a respective resistor 201 can be an NMOS transistor device. In an example implementation, digital control code 180 can be a n-bit resistor code, e.g., including control bits d0, . . . , dn, conveyed on a bus 181 with each respective bit input to a respective gate of a respective transistor 202 of the array to enable the switching in of the particular resistor 201 connected to that respective transistor. Dependent upon the programmed digital control code 180, one or more resistors of the array 200 are digitally switched in to achieve a bias current flow to the oscillator that ensures a desired oscillator signal amplitude and achieves a stable VCO oscillation with acceptable phase noise margin. In an embodiment, n can be any amount up to four or more bits, e.g., 6-bits.

Figure 2:
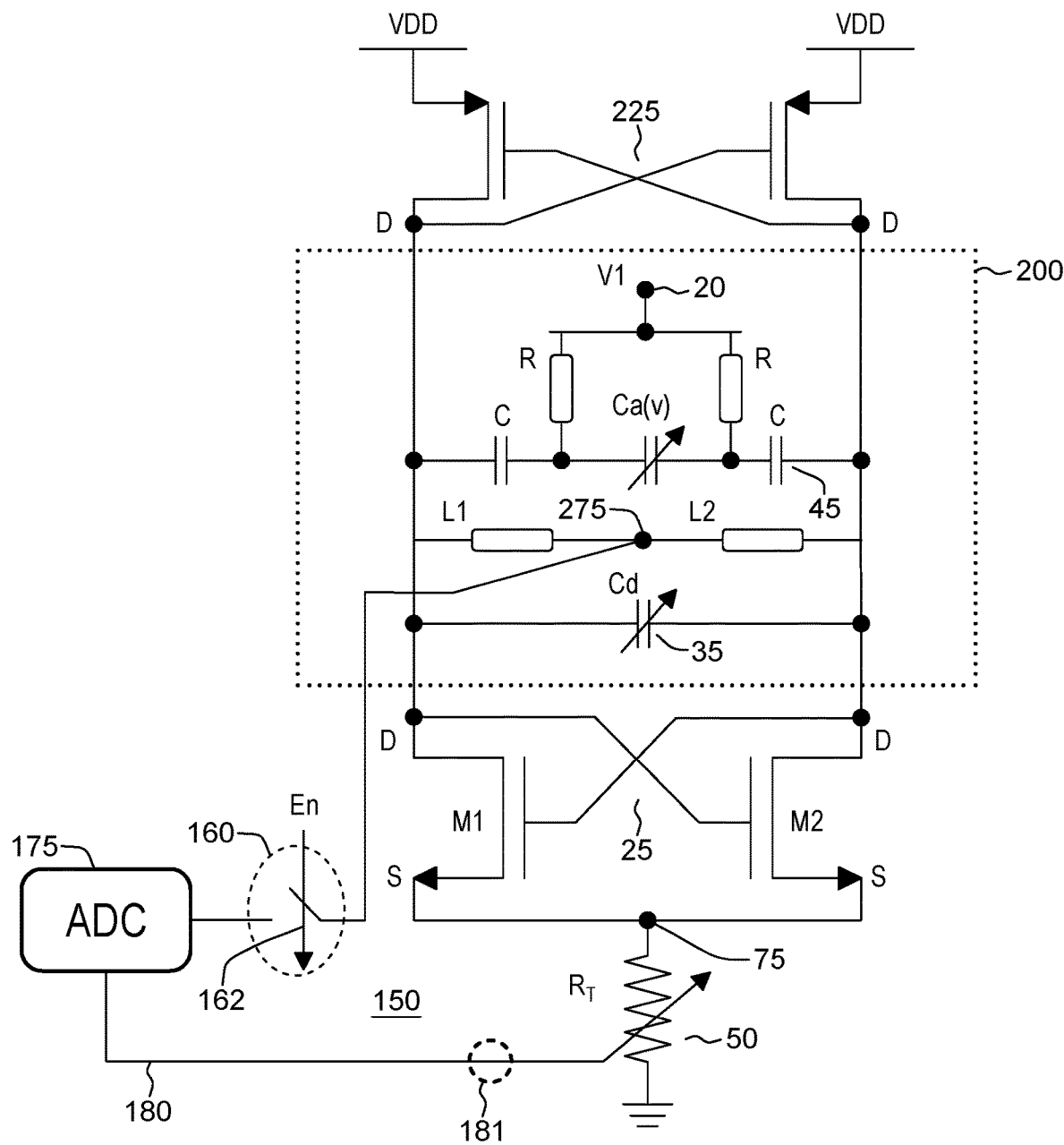
FIG. 2 is a circuit schematic depicting a further embodiment of a VCO circuit for use in any circuit application requiring a linearized wide tuning range that additionally employs further digital amplitude control based on a measured common node voltage in the tank circuit of the VCO according to an embodiment.

FIG. 2 is a circuit schematic depicting a further embodiment of a VCO circuit 20 for use in any circuit application requiring a steady state oscillation signal that employs additional digital amplitude control based on a further common mode voltage measured at the tank circuit 200 of the VCO according to an embodiment. In the embodiment of FIG. 2, the VCO circuit 20 additionally employs digital amplitude control based on a measured voltage, e.g., common mode voltage, provided in the tank oscillator circuit 200, corresponding to or being a variation of the oscillator circuit 100 of FIG. 1. As shown in FIG. 2, tank circuit 200 can be any LC-type tank oscillator comprising active and passive components. As shown in FIG. 1, the tank circuit 200 is connected at one end in parallel with cross-coupled transconductor pair 25, as in the embodiment of FIG. 1, and is further connected at an opposite end in parallel with a second cross-coupled transconductor pair of transistors 225 and which include cross-coupled pair of PMOS transistors. Both cross-coupled transconductor pairs of transistors 25, 225 of FIG. 2 receive current from source supplied by voltage supply VDD (e.g., providing approximately 1.0 Volts).

In the embodiment of FIG. 2, the oscillator tank circuit 200 at nodes corresponding to the drain terminals of corresponding NMOS transistors M1, M2 includes a parallel configuration of series connected capacitors that couple alternating current (AC) signals. The parallel configuration of capacitors include at least one switched capacitor 35 ($C_d$) having terminals connected to respective drain terminals (D) of cross-coupled transistors pair M1, M2. A further configuration of series connected capacitors 45 is connected in parallel with switched capacitor 35 that connect to respective drain terminals (D) across the cross-coupled transistor pair 25. In the embodiment shown, the second series 45 of the parallel stack includes three capacitors connected in a series. In the embodiment as shown, in series connection 45, the second capacitor includes a variable capacitor such as a varactor $C_a(V)$, the varactor $C_a(V)$ being connected to separate or same tuning voltage source(s) supplying a bias voltage V1 to the varactor via respective biasing (DC voltage) resistors (R). The voltage sources supplying bias voltage V1 can be generated on chip. In an embodiment of the tank circuit 200 shown in FIG. 2, a series connection 55 of inductors, comprising inductors L1, L2, is shown further connected in parallel to switched capacitor 35 and series connected capacitors 45. In an embodiment, inductors L1, L2 can include a balun or transformer coils. As shown, the node connecting the coils or inductors L1 and L2 defines a second common mode node 275, i.e., an inductor center tap. In an embodiment, common node terminal 275 of the series connected inductors L1, L2 node is alternatively used as a common mode terminal switchable for inclusion in the ADC loop circuit 150 of FIG. 1 for digital control of the VCO output signal, e.g., differential positive and negative outputs at the respective drain terminals of M1, M2 as shown in FIG. 2. In the embodiment of FIG. 2, responsive to ADC loop measurement of the voltage at the second common mode node 275, the switched in ADC will responsively output a digital control code 180 for input to the tail resistor $R_T$ value via the digital signal bus, e.g., bus 181. The sensing of the common node voltage at common nodes 75 or 275 can be performed in the alternative as a single VCO output amplitude digital tuning event, or additionally as two or more separate VCO output amplitude digital tuning events.

Figure 3:
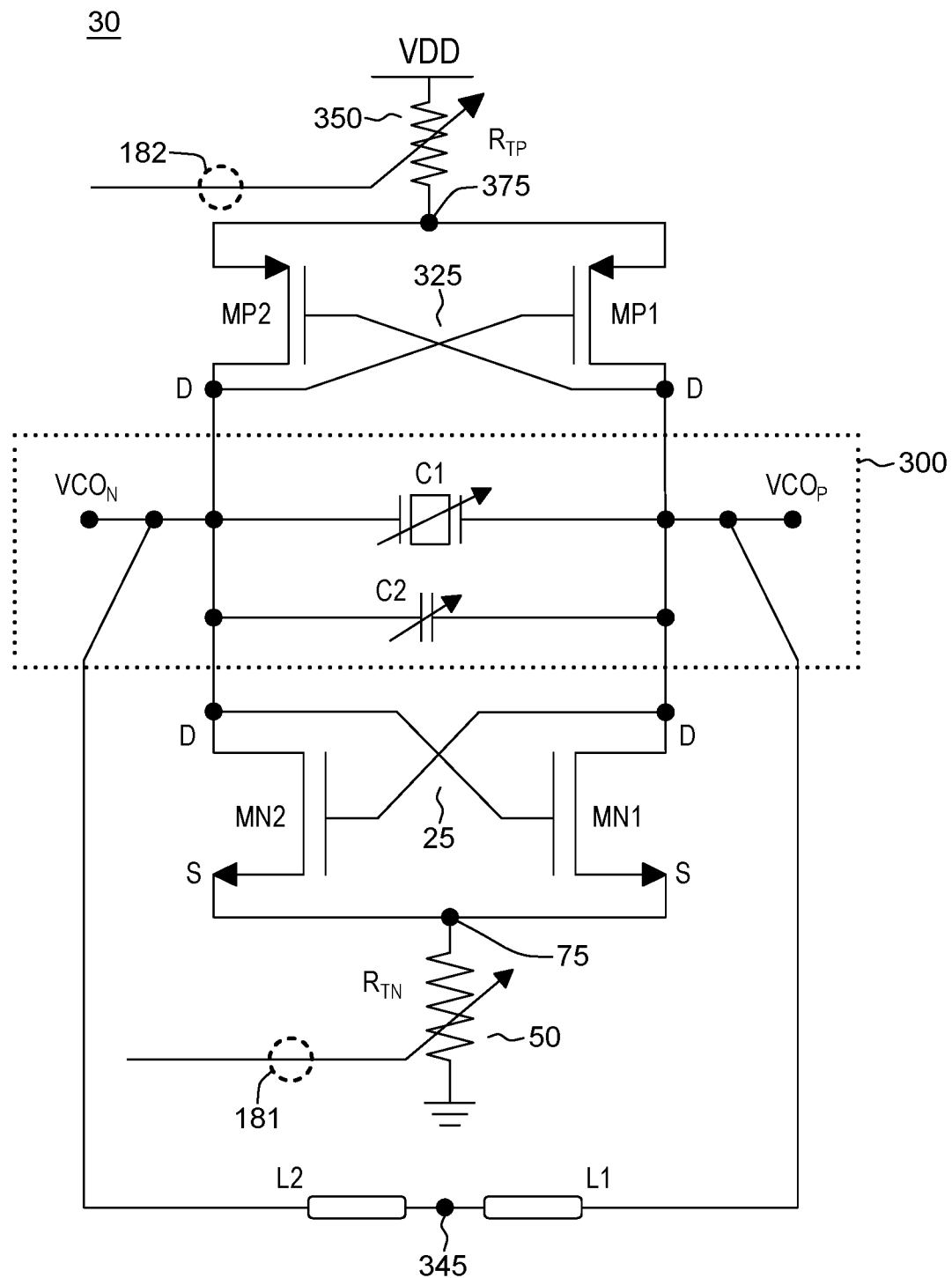
FIG. 3 is a circuit schematic depicting a further embodiment of a VCO circuit for use in any circuit application requiring a linearized wide tuning range that additionally employs further digital amplitude control based on a further common node voltage in the tank circuit according to an embodiment.

FIG. 3 shows a further embodiment of a VCO circuit 30 for use in any circuit application requiring a steady state oscillation signal. In the embodiment depicted in FIG. 3, a linearized wide tuning range VCO circuit 30 employs digital amplitude control based on sensed voltage, e.g., common mode voltage, as in the VCO circuit of FIG. 1. The VCO circuit 30 of FIG. 3 includes a tank oscillator circuit 300, which may be the oscillator circuit 100 of FIG. 1 or 2, or any tank oscillator comprising active and passive components, and which is connected at opposite ends to two respective cross-coupled MOSFET transconductor pairs 25, 325 in parallel. For example, the tank oscillator circuit 300 of FIG. 3 includes a parallel connection of a varactor (e.g., variable voltage capacitor) C1, switchable capacitor C2 and a series connection of coils (e.g., inductors) L1, L2 which may include an inductor or balun or transformer coils. In an embodiment, a common terminal 345 of the series connected inductors L1, L2 node can be used as a second common mode terminal switchable for inclusion in the ADC loop circuit 150 of FIG. 1 and in which the ADC 175 responsively outputs a digital code word via bus 181 for digital control of the VCO output signal amplitude via variable resistor 50, e.g., differential positive and negative outputs $VCO_P$ and $VCO_N$ respectively as shown in FIG. 3.

In the VCO 30 of FIG. 3, connected in parallel with the tank circuit 300, the first cross-coupled MOSFET transconductor pair 25 includes the cross-coupled metal-oxide-semiconductor (MOS) field effect transistor (FET) configuration of FIG. 1 including an internal pair of MOS transistor M1 and MOS transistor M2 each having a gate, drain (D) and source (S) terminals, where the gates of each M1, (M2) device are connected to the drains (D) of the opposite device M2, (M1). As in the embodiment of FIG. 1, the cross-coupled transistor source terminals provide a first common connection or NMOS node 75 to ground through the tail resistor 50 indicated as tail resistor $R_{TN}$ in FIG. 3. This first common connection 75 is a common-mode terminal providing a voltage which can be switched in for sensing in the ADC digital control loop 150 shown in FIG. 1 and in which the ADC 175 responsively outputs a digital code word for programming tail resistor 50 to provide VCO digital amplitude control via bus 181.

In the embodiment of FIG. 3, a second cross-coupled MOSFET transconductor pair 325 is connected in parallel with the tank circuit 310 and includes a second pair of cross-coupled MOSFETs (e.g., PMOS) having respective source terminal connections connected to a voltage power supply, VDD, that supplies bias current to the tank circuit 300 through a tail resistor on the supply side, i.e., a "PMOS tail" resistor 350 indicated as resistor $R_{TP}$ in FIG. 3. The cross-coupled transistor source terminals of the second cross-coupled MOSFET transconductor pair 325 provide a common connection or a third common node 375 (e.g., a common PMOS node) to the PMOS tail resistor 350. This common connection is a common-mode terminal providing a voltage which can alternatively or additionally be switched in for sensing in the ADC digital control loop 150 shown in FIG. 1 and in which the ADC 175 responsively provides a digital signal output that can be read by a processor for outputting a digital code word for programming PMOS tail resistor 350 to provide VCO digital amplitude control via a second digital signal bus 182.

In the VCO circuit 300 depicted in FIG. 3, the MOS FETs of MOSFET transconductor pair 25 are shown as N-channel MOS devices MN1, MN1, and the MOS FETs of MOSFET transconductor pair 325 are shown as P-channel MOS devices MP1, MP2, it is understood that difference combinations of N-channel/P-channel MOS FET devices can be implemented. Further, any of the common mode nodes 75, 345 or 375 in the VCO 300 of FIG. 3, can be used to provide the information on the VCO swing for use in digital control of the amplitude using the ADC digital control loop circuit 150 of FIG. 1 to alternatively program, or in succession, additionally program the tail resistor 50, PMOS tail resistor 350 or both via a bus 181 and PMOS tail resistor 350 via a bus 182 to provide VCO digital amplitude control.

Figure 4B:
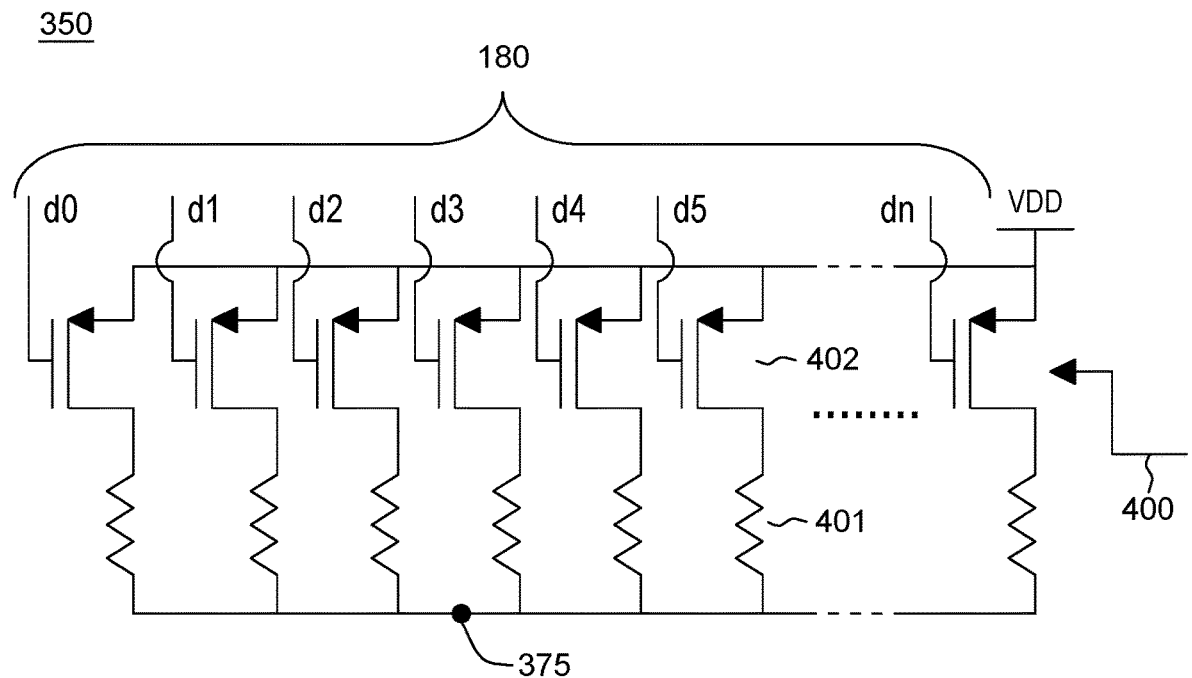
FIG. 4B shows a second embodiment of a digitally programmable "PMOS tail" resistor $R_{TP}$ responsive to digital code word provided in ADC circuit loop for controlling VCO output signal amplitude according to a further embodiment.

FIG. 4B shows a detailed embodiment of tail resistor $R_{TP}$ 350 of FIG. 3 including node 375 at which the common mode voltage is measured by the ADC 175 in ADC circuit loop 150. In the embodiment of FIG. 4, the tail resistor is a resistor array 400 with parallel connected resistors 401, each respective resistor connected in series with a respective transistor device 402 operable in the linear region and each gated under control of a respective digital control bit signal which may be part of a bit coded word 180 output of the ADC. The transistor device 402 in series connection with a respective resistor 401 can be a PMOS transistor device. In an example implementation, digital control code 180 can be a n-bit resistor code, e.g., including control bits d0, ..., dn, conveyed on a bus 181 with each respective bit input to a respective gate of a respective transistor 402 of the array to enable the switching in of the particular resistor 401 connected to that respective transistor. Dependent upon the programmed digital control code 180, one or more resistors of the array 400 are digitally switched in to achieve a bias current flow to the oscillator that ensures a desired oscillator signal amplitude and achieves a stable VCO oscillation with acceptable phase noise margin.

FIG. 5 shows a further application of digital amplitude control in an embodiment of a ring oscillator circuit or ring VCO (RVCO) 500 that includes a chain of differential delay cells 510 that are serially coupled to form the ring oscillator 500. Each oscillator delay cell 510 can be configured as a differential inverter, a schematic of different embodiments of which is exemplarily shown in FIGS. 6A and 6B. The outputs of the oscillator delay cells 510 are coupled to inputs of a next oscillator delay cell 510, so that a concatenation of oscillator delay cells 510 of a ring oscillator is formed.

The ring oscillator 500 has a number of oscillator delay cells 510 whose outputs are respectively coupled to an input of a next oscillator delay cell 510. In a differential configuration, each of the oscillator delay cells 510 has a first input, a second input, a first output and a second output. A signal applied to the first input is inverted and the inverted signal is applied to the first output after a predetermined delay. Analogously, a signal applied to the second input is inverted and the inverted signal is applied to the second output after the predetermined delay. The oscillator delay cells 510 are preferably identical and each of the oscillator delay cells 510 is configured to have an equal delay time.

As known, the ring oscillator 500 can have an odd number or even number of oscillator delay cells 510, with each stage implemented in CMOS. In an embodiment, as shown in FIG. 5, each tunable differential delay inverter stage receives differential input signals $V_{IN}+$ and $V_{IN}-$ and outputs differential signals $V_{OUT}+$ and $V_{OUT}-$. In an embodiment using an even number of delay stages, a positive polarity input $V_{IN}+$ of the first stage 512 in the chain takes the signal from the positive polarity output $V_{OUT}+$ from the last delay stage 515 in the chain. The negative input $V_{IN}-$ of the first delay stage in the chain takes the signal from the negative polarity output $V_{OUT}-$ from the last delay stage in the chain.

In accordance with embodiments herein, each delay stage 510 employs, under processor control, a switch to switch in the ADC 175 and ADC loop circuit 150 connection such as shown in FIG. 1, to provide digital control of the ring oscillator device amplitude. Each of the stages use the exact same delay cell, so digital control code that is used will apply to all the delay cells concurrently.

In a first embodiment, a delay stage of the ring oscillator 500 is shown in FIG. 6A which depicts a tunable differential delay inverter stage 600 whose delay can be tuned by a tail current source, i.e., a bias circuit, embodied as programmable tail resistor 650 connected to ground for controlling the bias current to the ring oscillator differential delay inverter stage 600. In an embodiment, differential input signals $V_{IN}+$ and $V_{IN}-$ are supplied to the gates of first and second NMOS transistors M1 and M2 respectively. The delay stage 600 generates two output signals such that the first and the second output signals $V_{OUT}-$ and $V_{OUT}+$ are generated at the drains of the first and second NMOS transistors M1 and M2, respectively. As shown, the gates of the first and second PMOS transistors M3 and M4 are connected to each of the drain of the first and second NMOS transistors M1 and M2. Transistors M3 and M4 are the load for the transistors M1 and M2, and provide gain and phase shift to the input signal. In an embodiment, the tail resistor 650 of FIG. 6A corresponds to the resistor array 400 of FIG. 4A. At a node 675, the voltage across programmable tail resistor 650 can be switched in by a connected switch 160 of the ADC loop 150 of FIG. 1 for sensing by the ADC 175 of the ADC loop 150 of FIG. 1. Based on the sensed voltage at node 675, the ADC provides a digital code that is read by a processor configured to generate a digital code word to program the resistance of the tail resistor 650 to control the bias current to ensure a desired delay setting in order to control the RVCO oscillation frequency.

In a further embodiment, a delay stage of the ring oscillator 500 is shown in FIG. 6B which depicts a tunable differential delay inverter stage 610 whose delay can be tuned by both a PMOS tail current source, i.e., a first bias circuit embodied as programmable PMOS tail resistor 680 tied to the power supply voltage source VDD to provide a bias current, and an NMOS tail current source, i.e., a second bias circuit, embodied as programmable tail resistor 690 connected to ground to provide a tail bias current. That is, both PMOS current source and NMOS current source can be used for controlling the delay of the differential delay inverter stage 610. In an embodiment, the PMOS tail resistor 680 of FIG. 6B corresponds to the resistor array 400 of FIG. 4 and the NMOS tail resistor 690 of FIG. 6B corresponds to the resistor array 200 of FIG. 2. At a node 685, the voltage at programmable PMOS tail resistor 680 can be switched in by a connected switch 160 of the ADC loop 150 of FIG. 1 for sensing by the ADC 175. Alternatively, or in addition, at a node 695, the voltage across programmable NMOS tail resistor 690 can be switched in by a connected switch 160 of the ADC loop 150 of FIG. 1 for measuring by the ADC 175. Based on the measured voltage at node 685, 695, or voltages at both nodes 685, 695, the ADC 175 is configured to generate a digital code word used to program the resistance of the respective PMOS tail resistor 680, tail resistor 690 to control the bias current(s) to ensure a desired delay setting in order to control the RVCO oscillation frequency. The gain of the differential delay cell is obtained by the ratio of the transcondactance of the NMOS and PMOS transistors, and the delay is obtained by the time constant at the output of the delay cell.

Figure 7:
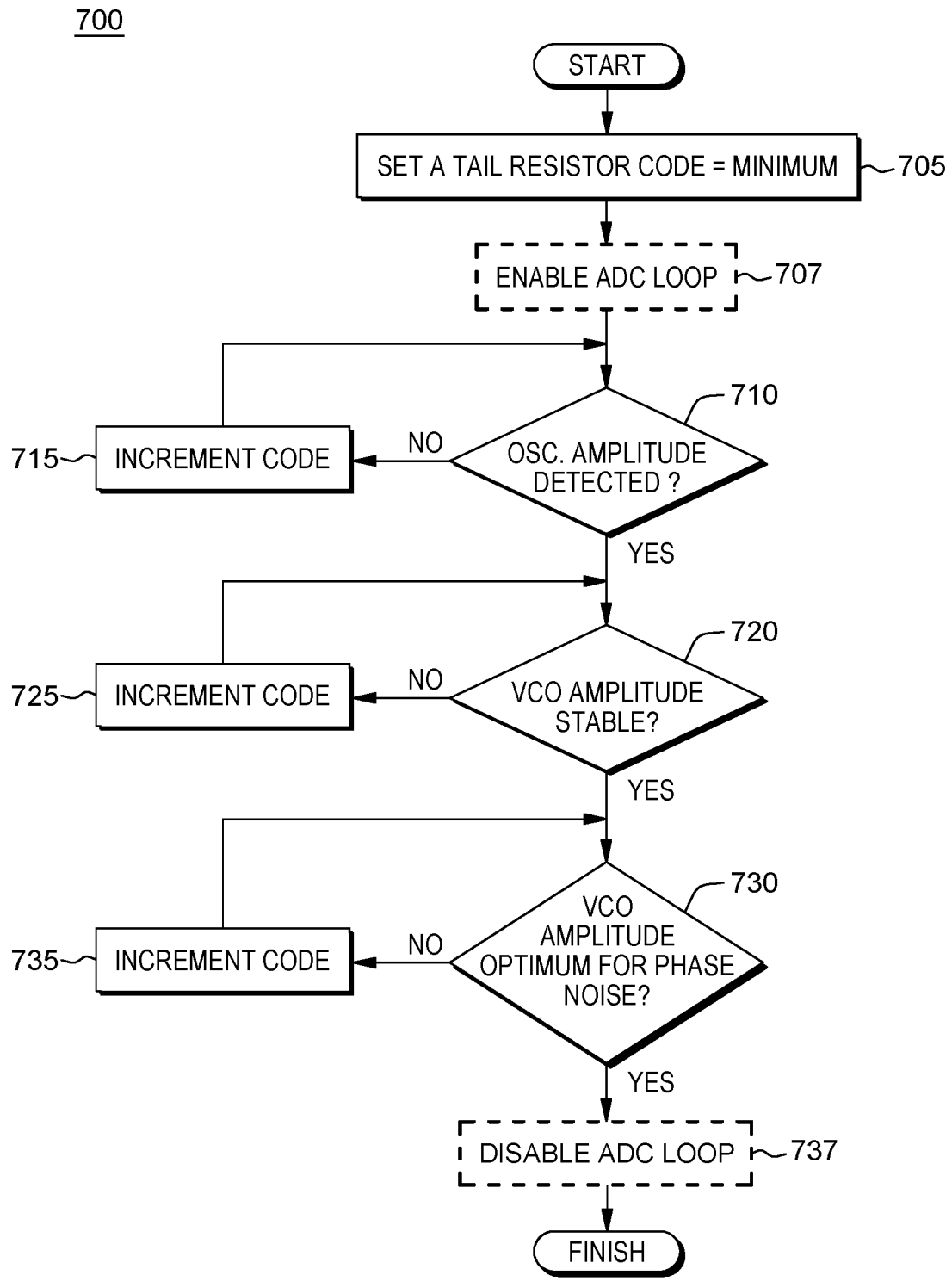
FIG. 7 depicts a method of operating the VCO oscillator circuit of the exemplary embodiments shown in FIGS. 1, 2 and 3 and operating the delay stages of the RVCO of FIG. 5.

FIG. 7 depicts a method 700 of operating the VCO oscillator circuit of the embodiments shown in FIGS. 1, 2 and 3 and the ring oscillator stages of FIGS. 5, 6A, 6B. At a first step 705, a separate controller element, e.g., a hardware processor core, can be programmed to set forth a minimum tail resistor code value (digital amplitude code word). This digital code word is associated with an initial value that is used to configure the tail resistor, e.g., resistor 75 in the various embodiments of the VCO circuits 10, 20 and 30. Upon startup of the VCO circuit, at 707, the hardware processor issues an enable signal 162 to activate switch 160 to switch in the ADC 175 of the ADC circuit loop to couple the ADC 175 to the common node in order to measure the DC voltage at the common node. In an embodiment, the processor sets an enable switch, e.g., En=1, so that the tail voltage is sensed, and a digital code is provided to the tail resistor array to adjust the resistor, and the tail current consumption, using the feedback loop. For purposes of illustration, the common node voltage is at the tail resistor node 75 of FIGS. 1-3. In alternative embodiments, the switch may alternatively switch in the ADC circuit loop 150 to couple the common node 275 or 345 in the tank circuit in the embodiments of FIGS. 2 and 3 or at the PMOS tail resistor common node 375 of FIG. 3. In an embodiment, the digital code words for amplitude control are stored in a pre-determined look-up table in an associated processor memory which can be accessed by the processor for conveyance on the signal bus 181, 182 to program the respective NMOS or PMOStail resistors. The pre-determined look-up table tabulates VCO amplitude and the corresponding phase noise numbers. Then, at 710, a determination is made as to whether a voltage amplitude is detected at the measured node 75 (or node 275, 345, or 375). That is, based on the measured voltage value at a node, the ADC 175 outputs a corresponding digital word on the signal bus and that is read by the processor to accordingly make decisions for digital amplitude control. If no voltage amplitude is detected, then the process continues to 715, where the processor device increments the digital code word used to program the tail resistor. The digital code word is incremented and conveyed on a signal bus to the coupled programmable tail resistor. The process then returns to 710 to determine whether the ADC 175 measures a voltage indicating presence of the VCO oscillation output signal.

Figure 8A:
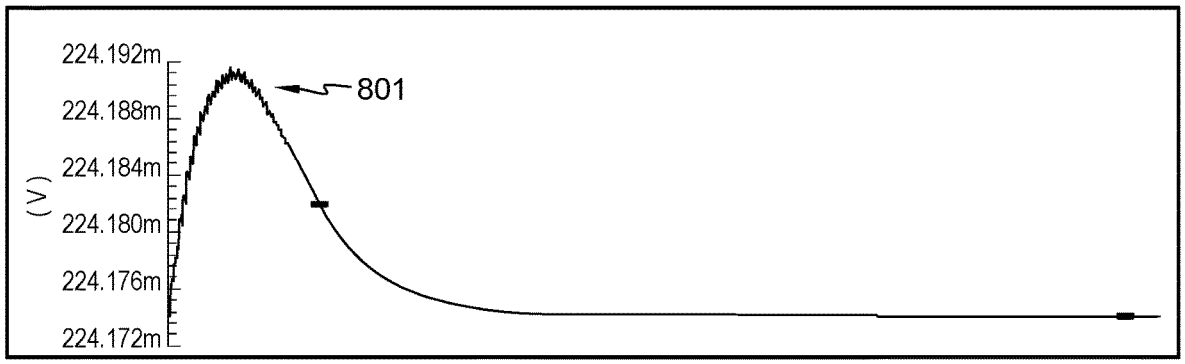
FIGS. 8A-8C depict various voltage states at the common node of the VCO tail resistor measured by the ADC in the switched ADC circuit loop including an initial voltage measurement at VCO startup and voltage measurement at VCO steady state operation.
Figure 8B:
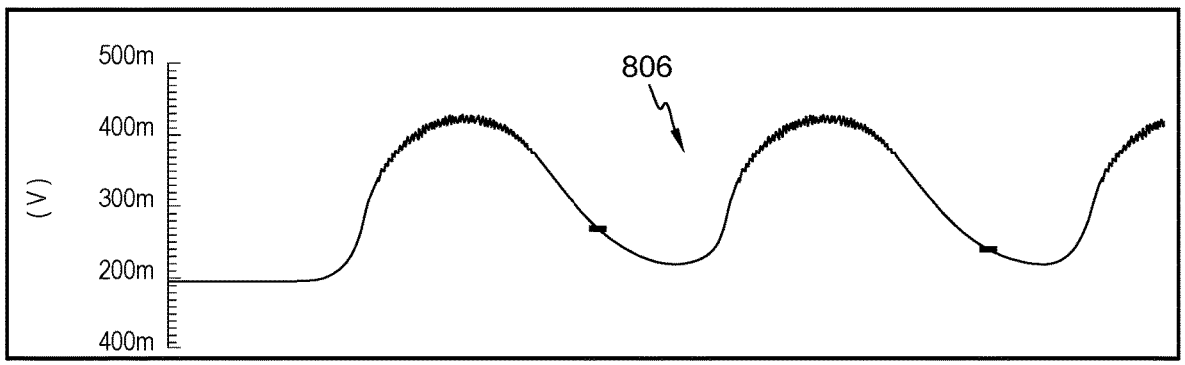
Figure 8C:
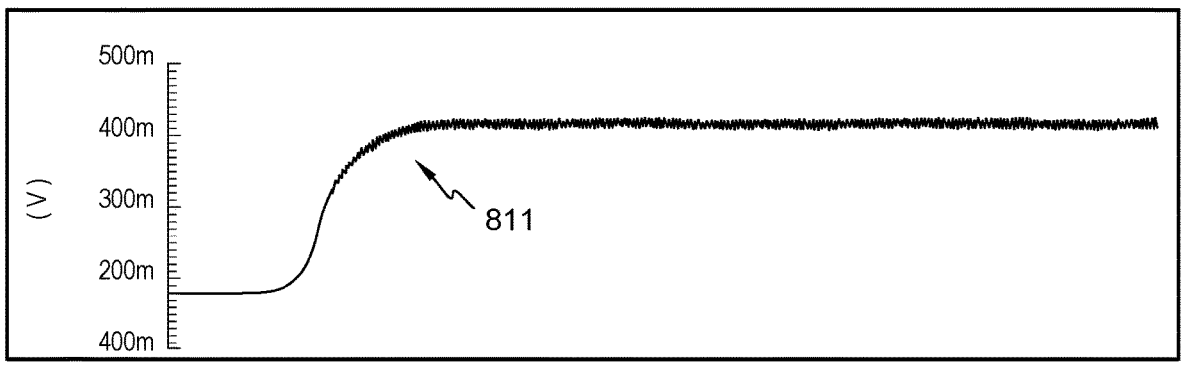

FIGS. 8A-8C depict various discernible voltage states at the common node 75 of the VCO tail resistor measured by the ADC in the switched ADC circuit loop including an initial voltage measurement at VCO startup and voltage measurement at VCO steady state operation.

Figure 9A:
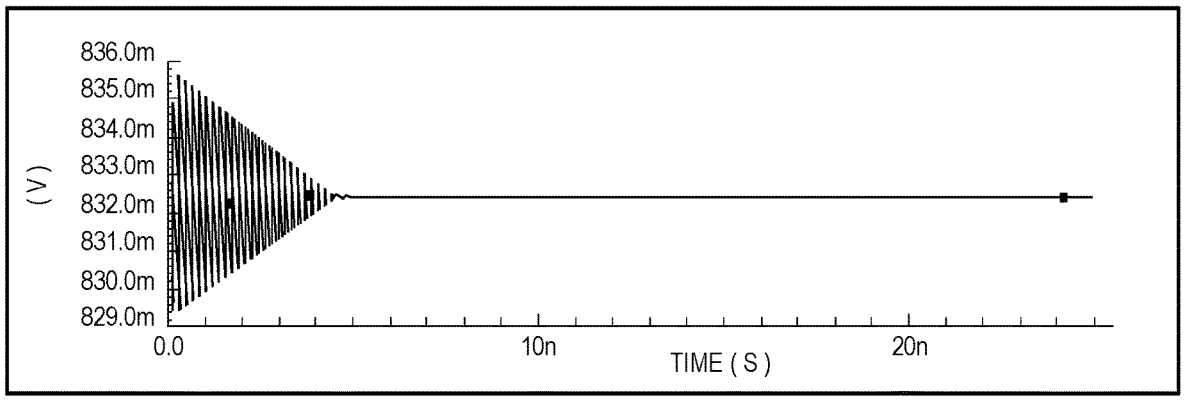
FIGS. 9A-9C depict various VCO circuit output signals corresponding to the various voltage states detected at the common node of the VCO tail resistor as shown in corresponding respective FIGS. 8A-8C.

For example, FIG. 8A depicts a timing diagram 800 of the common mode voltage sensed at common node 75 at a point before the VCO oscillation has started and no voltage amplitude is detected. Responsive to the initial digital code word value, a voltage jump 801 is sensed by the coupled ADC 175 of ADC loop 150 indicating presence of a VCO output oscillation is enabled. FIG. 9A is a diagram 900 depicting the corresponding VCO oscillator output signal at the point before VCO oscillation has started. Responsive to detecting the initial jump by the ADC, the processor responds to the ADC output code and generates a new digital code word for programming the tail resistor, e.g., to set the operating quiescent point of the VCO which causes an increase in the tail current through the VCO. This digital amplitude code can be a one-time code for optimum phase noise operation.

Figure 9B:
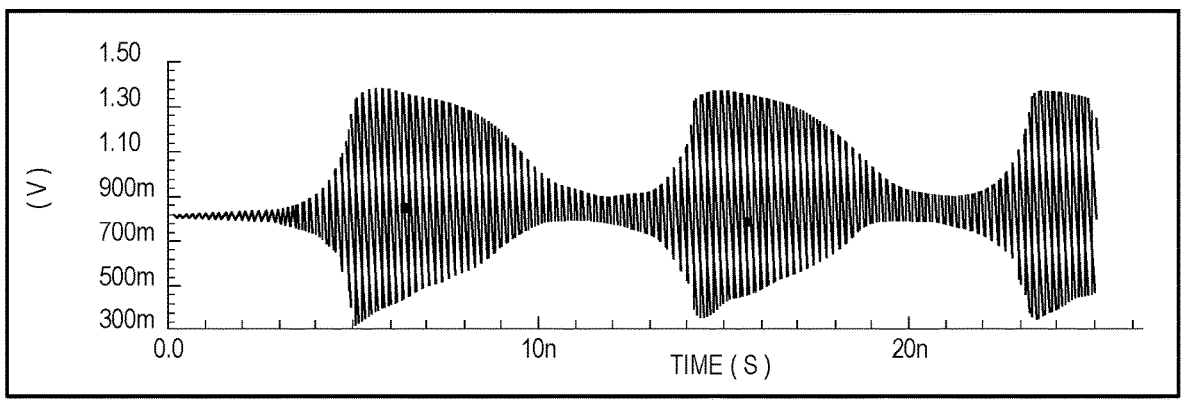

Responsively, as depicted in the timing diagram 805 of FIG. 8B, as current is increased the voltage can become amplitude modulated 806 indicating VCO output signal instability. FIG. 9B is a diagram 905 depicting the corresponding VCO oscillator output signal indicating a VCO oscillation output signal instability.

Thus, returning to FIG. 7, the determination is made at 720 to determine whether the VCO output signal is stable or not. If the measurement by the coupled ADC 175 of the voltage at the common node 75 indicates an instability, the process continues to 725, where the processor device increments the digital code word used to program the tail resistor. The digital code word is incremented and applied to program the tail resistor. The process proceeds back to 725 to make a new ADC measurement and the processor determines whether the measured DC voltage indicates a stable VCO oscillation output signal, i.e., a quiescent VCO operating point has been reached.

Returning to the method of FIG. 7, at 730, a further determination is made by the processor as to whether the amplitude of the VCO output signal is optimum from a phase noise operation standpoint. If the processor determines from the ADC voltage measurement at common node 75 that the VCO amplitude is not optimum for phase noise, the process continues to 735 where the processor device increments the digital code word used to program the tail resistor. In an embodiment, the processor accesses the pre-determined look-up table tabulating VCO amplitude and the corresponding phase noise numbers. The digital code word is incremented and the process proceeds back to 730 where the ADC 175 makes a further voltage measurement to determine whether the VCO oscillation is stable and is optimum from a phase noise performance standpoint. These process steps may repeat until the measured common node voltage indicates the VCO output oscillation signal is at a stable amplitude and optimized for phase noise.

Figure 9C:
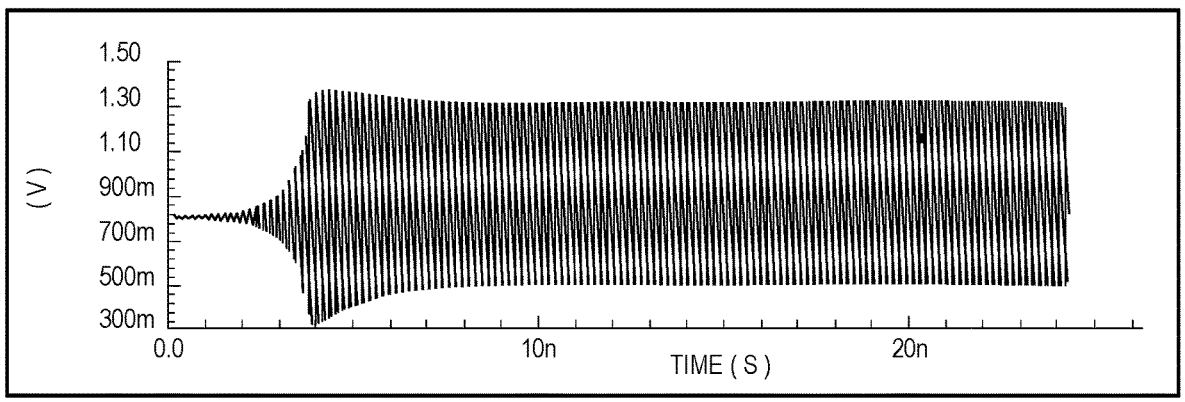

FIG. 8C depicts a timing diagram 810 of the voltage measured at the common node 75 showing the quiescent VCO operating point has been reached. At this point, the VCO output oscillation signal is at a stable amplitude 811 and optimized for phase noise. FIG. 9C is a diagram 910 depicting the corresponding stable VCO oscillator output optimized for phase noise.

Returning to FIG. 7, once the measured common node voltage indicates the VCO output oscillation signal is at a stable amplitude and optimized for phase noise, the control processor will deactivate the ADC loop and decouple the loop from the common node voltage at 737 and the process terminates. That is, the processor can assert a deactivate switch signal, e.g., set En=0, which disconnects the common node from any unwanted disturbance resulting from the noise on the signal bus.

Variations of the method 700 can be implemented. For example, in determining optimum stable oscillator output and phase noise, the processor can look at a plurality of the common mode voltages. As an example, a first ADC loop measurement taken at step 710 may be performed at one common node, e.g., node 75, and a digital amplitude code word is applied to configure the tail resistor 50 according to the measured voltage. Alternatively, the first ADC loop measurement taken at step 710 may be performed at common node, e.g., node 375 in the embodiment of FIG. 3, and a digital amplitude code word is applied to configure the PMOS tailresistor 350 according to the measured voltage.

In this variation, after the initial common mode measurement (e.g., at node 75 or 375) a voltage at another common node may used to measure amplitude stability and/or phase noise, e.g., node 275 in FIG. 2 or node 345 in FIG. 3. In this variation, after the initial ADC measurement at 710, the ADC may be disconnected by opening switch 160 in ADC loop 150 to decouple it from the initial measurement node. Then, the processor couples a new common node to the ADC loop 150 in which the ADC is programmed to take the next measurement at another common node, e.g., node 345 in the embodiment of FIG. 3, to determine VCO amplitude stability and/or phase noise.

In a further embodiment, there can be programmed an upper bound of the calibration for each of the common node voltages. For example, an overall function is defined, that would take care of the individual common node voltages and optimize each one of them. As an example, the common mode voltage at the PMOS tail resistor can be 80% of the supply voltage, the common mode voltage at the inductive element can be 50% of the supply voltage, and the common mode voltage at the NMOS tail resistance can be 20% of the supply voltage. For example, depending on the oscillator topology, the processor can choose to implement PMOS tail resistor ($R_{TP}$) code calibration until a certain amplitude is reached, and then exercise the $R_{TN}$ tail resistor code. That is, there may be initially applied a coarse adjustment to program the tail resistor to compensate for process variations. Then, a fine adjustment may be programmed where fine implies small variations to achieve the best possible jitter performance "after" the coarse adjustments are performed. A coarse adjustment may utilize a digital code word of less number of bits (e.g., 2 bits) and fine adjustment uses a greater number of bits (e.g., 6 bits).

In an embodiment, the programming under digital control of the tail resistor $R_T$ 50 provides a rectification function on the VCO output voltage amplitude. In an example embodiment, the tail voltage corresponds to the peak to peak amplitude in a parabolic curve according to:

Vtail≈−0.75(X−0.45)$^2$+0.25(X−0.45)+0.5, where X is the peak to peak swing. This equation changes coefficients depending on the oscillator topology, and the type of transistors used.

The ripple in the tail voltage after rectification, in an embodiment, can be set to 10 mVpp and defines a bound.

As mentioned, the low power VCO oscillator circuits 10, 20, 30 of the embodiments depicted in FIGS. 1-3 with digital amplitude control can be incorporated in any electronic system having circuit applications requiring a steady state oscillation signal, e.g., memory peripheral circuits, sensor nodes. For example, oscillators (VCOs) are typically used as peripheral circuits for MRAM systems, and in any non-volatile memory systems generally, there is a need for clock, and the low power VCO oscillator with digital amplitude control according to embodiments herein provides the autonomous clock generation.

Figure 10:
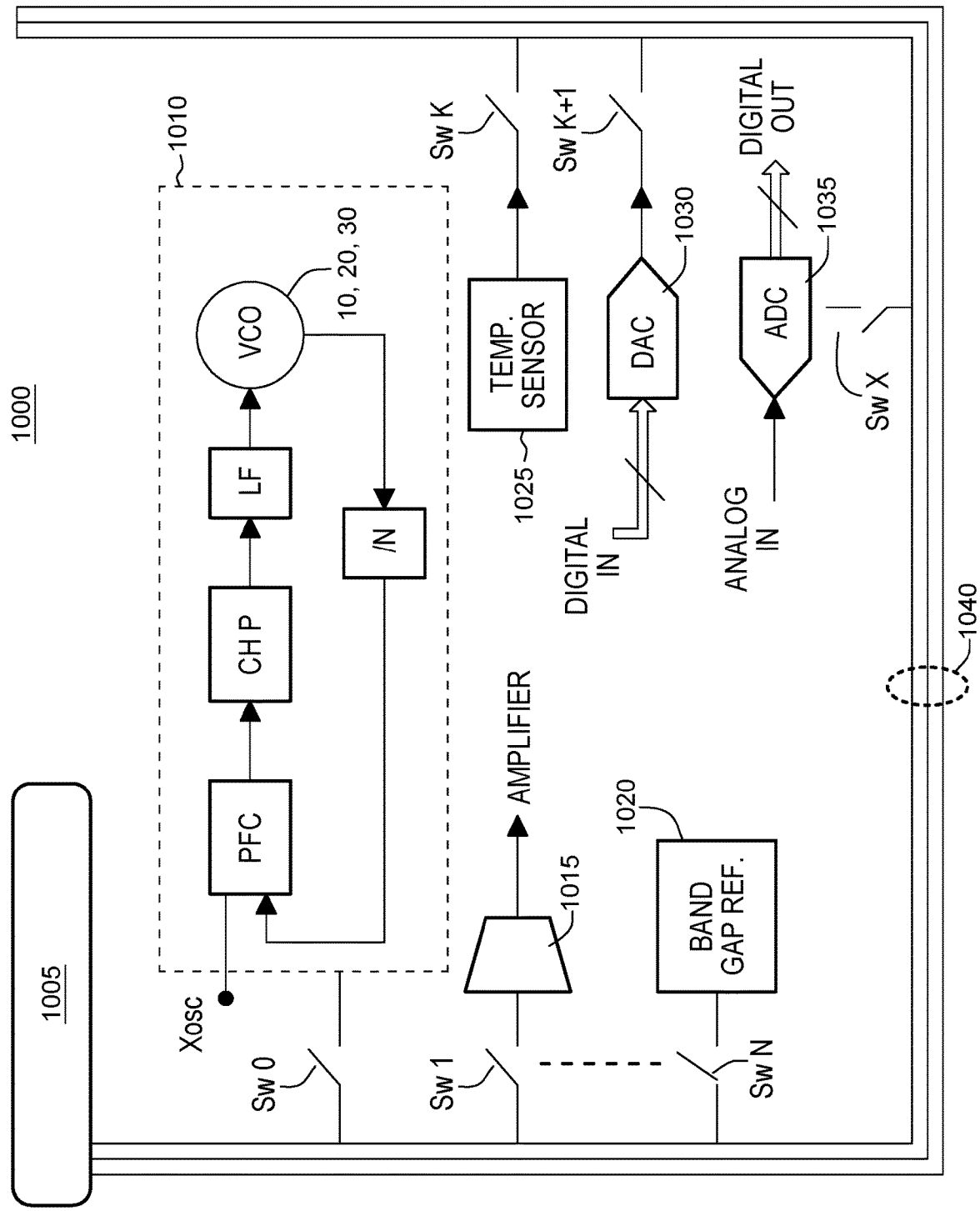
FIG. 10 depicts an on-chip system that comprises many functional blocks in a test configuration and in which the ADC measurement loop circuit is shared among many functional blocks in an embodiment.

For example, as shown in FIG. 10, there is depicted an on-chip system 1000 that comprises many functional blocks in a test configuration. For example, a processor such as a digital microcontroller 1005 can operatively interact and/or enable operation of various functional blocks including, for illustrative purposes, such blocks as a Phase Lock Loop (PLL) oscillator 1010, an amplifier circuit 1015, a band gap reference circuit 1020, a temperature sensor/circuit 1025, an digital to analog converter (DAC) circuit 1030 and an ADC circuit 1035, etc. In one embodiment, the ADC circuit 1035 is a shared resource, i.e., shared among the various functional blocks of the system 1000.

In the system 1000 shown in FIG. 10, there is a switch associated with each functional block for enabling access to a signal bus 1040. As depicted in FIG. 10, respective switches Sw_0, . . . , Sw_X connect respective functional blocks to signal test bus 1040. One of the functional blocks include the ADC measurement circuit 1035 which can be switched in a circuit and shared among many analog functional blocks for SAR ADC measurements, including the common node voltage sensing for controlling oscillator output signal amplitude according to embodiments herein to reduce the overall cost of implementation with low on-chip area overhead, and provide a scalable implementation. The ADC 1035 is shared by many analog blocks, each having its own enable (En) signal, which can be activated by the microcontroller 1005 and multiplexed at the input of the test ADC.

As an example implementation shown in FIG. 10, a high-level PLL circuit 1010 is activated by switch Sw_0. The PLL employs the voltage controlled oscillator (VCO) with digital amplitude control according to an embodiment herein. For example, the PLL 1010 includes an input receiving an reference oscillator signal (XOSC or crystal oscillator) at a reference frequency which is input through a first frequency divider circuit (not shown) to divide down the frequency. In the specific arrangement of PLL 1010, the divided down reference frequency signal is then input to the phase frequency detector (PFD) which receives a PLL output feedback signal and provides an output signal characterizing the state of the loop, i.e., whether a specific operating frequency has been achieved. The PFD phase frequency difference signal is input to the charge pumps (CH P) to generate a signal that is filtered by loop filter element (LF) to remove any ripple. In an embodiment, the loop filter output signal is input to the VCO according to embodiments depicted in FIG. 1, 2 or 3. The output signal of the VCO 1010 is fedback to the PFD through a further divider (/N) in FIG. 10 which determines the "divide by" output.

In an embodiment, the SAR_ADC 1035 of the ADC loop 150 is a shared resource that is programmatically connected to the common node of the VCO circuit via controlled operation of an enable switch (Sw_X). The activating of switch Sw_X couples the ADC measurement loop under enable control signal (En) which can be sourced from the on-chip microcontroller (not shown) controlling on-chip system operations. The test ADC is shared by many analog blocks, each having its own enable signal and multiplexed at the input of the test ADC. Thus, in the PLL 1010, the VCO common node signal is monitored by switching in the ADC loop 150 via switch Sw_X using the enable signal asserted by the microcontroller 1005.

In operation, the enable (En) signal is implemented by a switch, e.g., realized using MOS transistors. In an embodiment, when En=1, the VCO tail voltage is sensed, and a digital code is provided to the tail resistor array to adjust the resistor, and the bias current consumption, using the feedback loop. Once the calibration is completed and/or immediately after coupling the ADC for measurements, the En switch is deactivated by setting En=0 by the on-chip microcontroller, which disconnects the ADC loop from the functional block, e.g., common mode node, from any unwanted disturbance resulting from any noise on the digital signal bus 181 that can couple from other analog functional blocks to the oscillator (the ADC is shared among many analog blocks).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A voltage controlled oscillator (VCO) comprising:
   an active negative transconductance circuit comprising: cross-coupled transistor pair having drain terminals connected to a first end of a resonant tank circuit, said resonant tank circuit having a first common mode voltage node for amplitude detection;
   a programmable bias controller circuit coupled to the first common mode voltage node for detecting a VCO oscillation condition, said bias controller circuit controlling a resistance of a tail resistor coupled to source terminals of said cross-coupled transistor pair at a second common mode voltage node, said programmable bias controller circuit controlling a sinking of a bias current through the tail resistor for tuning an amplitude of a VCO output oscillating signal;
   a switch for coupling said first common mode voltage node to an analog to digital converter (ADC) element of said programmable bias controller through a shared test bus of an on-chip system, said ADC element sensing a voltage at the first common mode voltage node when said switch is activated and providing a digital control signal; and
   a signal bus for carrying said digital control signal to said tail resistor, the tail resistor programmed to a certain resistance according to bit values of said digital control signal for controlling the amplitude of said VCO output oscillating signal.

2. The VCO as claimed in claim 1, wherein said digital control signal for controlling the amplitude of said VCO output oscillating signal further optimizes a phase noise of said VCO output oscillating signal.

3. The VCO as claimed in claim 1, wherein said tail resistor is an array of parallel connected resistors, a respective resistor of said array connected in series to a respective transistor element, wherein said digital control signal includes a plurality of logic bits, a logic bit associated with a respective transistor element for activating or deactivating said respective transistor element and the respective connected resistor from said array of parallel connected resistors.

4. The VCO as claimed in claim 1, wherein the cross-coupled transistor pair comprise n-channel metal oxide semiconductor (NMOS) field effect transistors, p-channel metal oxide semiconductor (NMOS) field effect transistors, or an NMOS and a PMOS field effect transistor.

5. The VCO as claimed in claim 1, wherein said resonant tank circuit comprises:
  a capacitor element having a first terminal connected to a drain terminal of a first transistor of said cross-coupled transistor pair and a second terminal connected to a drain terminal of a second transistor of said cross-coupled transistor pair; and
  the first terminal of said capacitor element connected to a first end of a first inductor element, and the second terminal of said capacitor element connected to a first end of a second inductor element, wherein respective second ends of each said first inductor element and said second inductor element are connected to a first reference supply voltage.

6. The VCO as claimed in claim 5, wherein said capacitor element is a varactor, said varactor receiving a voltage for tuning a frequency of said VCO output oscillating signal.

7. The VCO as claimed in claim 5, further comprising:
  a second active negative transconductance circuit comprising: second cross-coupled transistor pair having drain terminals connected at a second end of the resonant tank circuit;
  a first reference voltage supply coupled to source terminals of said second cross-coupled transistor pair of said second active negative transconductance circuit.

8. The VCO as claimed in claim 7, wherein said first terminal of said capacitor element of said resonant tank circuit is further connected to a drain terminal of a first transistor of said second cross-coupled transistor pair of said second active negative transconductance circuit, and said second terminal of said capacitor element of said resonant tank circuit is further connected to a drain terminal of a second transistor of said second cross-coupled transistor pair of said second active negative transconductance circuit.

9. The VCO as claimed in claim 8, wherein said resonant tank circuit further comprises:
  a series connection of a first inductor element and a second inductor element, said series connection of the first inductor element and the second inductor element each having a common connected terminal defining a third common mode voltage node, said series connection of the first inductor element and the second inductor element connected in parallel with said capacitor element; and
  a second switch for coupling said third common mode voltage node to said ADC element, said ADC element sensing a voltage at the third common mode voltage node when said second switch is activated and providing a second digital control signal on said signal bus for carrying said second digital control signal to said tail resistor for alternatively or additionally controlling the amplitude of the VCO output oscillating signal.

10. A voltage controlled oscillator (VCO) comprising:
  a first active negative transconductance circuit comprising: first cross-coupled transistor pair having drain terminals connected to a first end of a resonant tank circuit;
  a first programmable tail resistor coupled to source terminals of said first cross-coupled transistor pair at a first common node, said first programmable tail resistor sinking a bias current through the resonant tank circuit for tuning an amplitude of a VCO output oscillating signal;
  a first switch for coupling said first common node to an analog to digital converter (ADC) element, said ADC element sensing a voltage at the first common node when said switch is activated and providing a first digital control signal;
  a first signal bus for carrying said first digital control signal to said first programmable tail resistor, the first programmable tail resistor programmed to a certain resistance according to bit values of said first digital control signal for controlling the amplitude of said VCO output oscillating signal; and
  a second active negative transconductance circuit comprising: second cross-coupled transistor pair having drain terminals connected to a second end of the resonant tank circuit;
  a second programmable tail resistor coupled to source terminals of said second cross-coupled transistor pair at a second common node, said second programmable tail resistor sourcing a bias current through the resonant tank circuit for alternatively or additionally tuning the amplitude of said VCO output oscillating signal;
  a second switch for coupling said second common node to the ADC element, said ADC element alternatively or additionally sensing a voltage at the second common node when said second switch is activated and alternatively or additionally providing a second digital control signal; and
  a second signal bus for carrying said second digital control signal to said second programmable tail resistor, the second programmable tail resistor programmed to a certain resistance according to bit values of said second digital control signal for alternatively or additionally controlling the amplitude of said VCO output oscillating signal.

11. The VCO as claimed in claim 10, wherein said first digital control signal and said second digital control signal for alternatively or additionally controlling the amplitude of the VCO output oscillating signal further optimizes a phase noise of said VCO output oscillating signal.

12. The VCO as claimed in claim 10, wherein each said first programmable tail resistor and second programmable tail resistor is an array of parallel connected resistors, a respective resistor of said array connected in series to a respective transistor element, wherein said respective first digital control signal and second digital control signal includes a plurality of logic bits, a logic bit associated with the respective transistor element for activating or deactivating said respective transistor element and the respective connected resistor from said respective array of parallel connected resistors.

13. The VCO as claimed in claim 10, wherein said resonant tank circuit comprises:

a capacitor element having a first terminal connected to a drain terminal of a first transistor of the first cross-coupled transistor pair and to a drain terminal of a first transistor of the second cross-coupled transistor pair, and having a second terminal connected to a drain terminal of a second transistor of the first cross-coupled transistor pair and to a drain terminal of a second transistor of the second cross-coupled transistor pair.

14. The VCO as claimed in claim 13, wherein said resonant tank circuit further comprises:
a series connection of a first inductor element and a second inductor element, said series connection of the first inductor element and the second inductor element each having a common connected terminal defining a third common node, said series connection of the first inductor element and the second inductor element connected in parallel with said capacitor element; and
a third switch for coupling said third common node to said ADC element, said ADC element alternatively or additionally sensing a voltage at the third common node when said third switch is activated and, in response alternatively or additionally providing a third digital control signal used for controlling the amplitude of the VCO output oscillating signal.

15. The VCO as claimed in claim 14, wherein said ADC element provides the third digital control signal to said first programmable tail resistor via said first signal bus, or alternatively or in addition provides the third digital control signal to said second programmable tail resistor via said second signal bus.

16. A method of operating a voltage controlled oscillator (VCO) circuit, the method comprising:
coupling a first common mode voltage node of an active negative transconductance circuit of the VCO to an analog to digital converter (ADC) element through a first programmable tail resistor coupled between the ADC element and the first common mode voltage node, said active negative transconductance circuit including a cross-coupled transistor pair having coupled source terminals defining said first common mode voltage node and having drain terminals connected to a first end of a resonant tank circuit;
upon initiating a circuit VCO oscillation, controlling said ADC element to sense a voltage at a second common mode voltage node at said resonant tank circuit of the VCO, said voltage sensing through a shared test bus of an on-chip system; and
controlling, a resistance value of the first programmable tail resistor coupled between said ADC element and the first common mode voltage node, said controlling comprising:
outputting by said ADC element, in response to said sensed voltage, a digital control signal; and
providing said digital control signal to said first programmable tail resistor and using bit values of said digital control signal to control the resistance value of said first programmable tail resistor for controlling an amplitude of a VCO circuit oscillator signal output.

17. The method as claimed in claim 16, wherein subsequent to providing said digital control signal to said first programmable tail resistor, said method comprising:
further sensing, by said ADC element, the voltage of the second common mode voltage node;
detecting, by said ADC element, whether said further sensed voltage indicates a stable VCO amplitude; and
modifying, using said ADC element, one or more bit values of said digital control signal provided to control the resistance value of said first programmable tail resistor until said further sensed voltage indicates the stable VCO amplitude and an optimum phase noise.

18. The method as claimed in claim 17, said method further comprising:
determining, from said sensed voltage of said second common mode voltage node, whether the amplitude is optimum for a phase noise of said VCO circuit oscillator signal output, and
modifying, using said ADC element, one or more bit values of said digital control signal to optimize, using said controlled resistance value, the phase noise of said VCO circuit oscillator signal output.

19. The method as claimed in claim 16, wherein said resonant tank circuit comprises a capacitor element having a first terminal connected to a drain terminal of a first transistor of said cross-coupled transistor pair and a second terminal connected to a drain terminal of a second transistor of said cross-coupled transistor pair, and a series connection of a first inductor element and a second inductor element, said series connection of the first inductor element and the second inductor element each having a common connected terminal defining the second common mode voltage node, said series connection of the first inductor element and the second inductor element connected in parallel with said capacitor element, said method further comprising:
activating a switch element for coupling, under control of a hardware processor element, the second common mode voltage node to the ADC element.

20. The method as claimed in claim 19, wherein said VCO circuit further comprises a second active negative transconductance circuit comprising: second cross-coupled transistor pair having drain terminals connected to a second end of the resonant tank circuit, and a second programmable tail resistor coupled to source terminals of said second cross-coupled transistor pair at a third common mode voltage node, said second programmable tail resistor sourcing a bias current through the resonant tank circuit for alternatively or additionally tuning the amplitude of said VCO circuit oscillator signal output, said method further comprising:
coupling, under control of a hardware processor element, the third common mode voltage node to the ADC element;
sensing, by said ADC element, the voltage at the third common mode voltage node through the shared test bus of the on-chip system;
outputting by said ADC element, in response to said sensed voltage at the third common mode voltage node, a second digital control signal;
providing said second digital control signal to said second programmable tail resistor and using bit values of said second digital control signal to control a resistance value of said second programmable tail resistor for controlling the amplitude of said VCO circuit oscillator signal output, wherein said coupling, sensing voltage at the third common mode voltage node and responsively providing the second digital control signal to the second programmable tail resistor is performed as an alternative to or in addition to the sensing voltage at the second common mode voltage node, and the responsive providing of the digital control signal to the first programmable tail resistor.

* * * * *